US012696483B2

(12) United States Patent
Hwang et al.

(10) Patent No.: US 12,696,483 B2
(45) Date of Patent: Jul. 28, 2026

(54) INTEGRATED ASSEMBLIES AND METHODS OF FORMING INTEGRATED ASSEMBLIES

(71) Applicant: Micron Technology, Inc., Boise, ID (US)

(72) Inventors: David K. Hwang, Boise, ID (US); Richard J. Hill, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 263 days.

(21) Appl. No.: 18/236,265

(22) Filed: Aug. 21, 2023

(65) Prior Publication Data

US 2023/0395723 A1 Dec. 7, 2023

Related U.S. Application Data

(62) Division of application No. 17/005,054, filed on Aug. 27, 2020, now Pat. No. 11,777,036.

(51) Int. Cl.
*H10D 30/67* (2025.01)
*H10D 86/01* (2025.01)
(Continued)

(52) U.S. Cl.
CPC ..... *H10D 30/6713* (2025.01); *H10D 30/6728* (2025.01); *H10D 30/673* (2025.01);
(Continued)

(58) Field of Classification Search
CPC ........... H10D 30/6713; H10D 86/0221; H10D 86/0212; H10D 86/40; H10D 30/673; H10D 86/60; H10D 86/481
(Continued)

(56) References Cited

U.S. PATENT DOCUMENTS 6,027,861 A 2/2000 Yu et al.
9,076,686 B1 7/2015 Karda et al.
(Continued)

FOREIGN PATENT DOCUMENTS

CN 105470303 4/2016
CN 202110972243.1 11/2025
WO WO 2021/227344 11/2021

OTHER PUBLICATIONS

Cao et al., "2-D Layered Materials for Next-Generation Electronics: Opportunities and Challenges", IEEE Transactions on Electron Devices vol. 65, No. 10, Oct. 2018, United States, pp. 4109-4121.
(Continued)

*Primary Examiner* — Ori Nadav
(74) *Attorney, Agent, or Firm* — Wells St. John P.S.

(57) ABSTRACT

Some embodiments include an integrated assembly having an upwardly-extending structure with a sidewall surface. Two-dimensional-material extends along the sidewall surface. First electrostatic-doping-material is adjacent a lower region of the two-dimensional-material, insulative material is adjacent a central region of the two-dimensional-material, and second electrostatic-doping-material is adjacent an upper region of the two-dimensional-material. A conductive-gate-structure is over the first electrostatic-doping-material and adjacent to the insulative material. Some embodiments include methods of forming integrated assemblies.

20 Claims, 10 Drawing Sheets

(51) Int. Cl.

| | |
|---|---|
| *H10D 86/40* | (2025.01) |
| *H10D 86/60* | (2025.01) |
| *G11C 11/22* | (2006.01) |
| *G11C 11/408* | (2006.01) |
| *G11C 11/4091* | (2006.01) |
| *H10D 62/80* | (2025.01) |

(52) U.S. Cl.
CPC ..... *H10D 86/0212* (2025.01); *H10D 86/0221* (2025.01); *H10D 86/40* (2025.01); *H10D 86/481* (2025.01); *H10D 86/60* (2025.01); *G11C 11/221* (2013.01); *G11C 11/2257* (2013.01); *G11C 11/2273* (2013.01); *G11C 11/4085* (2013.01); *G11C 11/4091* (2013.01); *H10D 30/6757* (2025.01); *H10D 62/80* (2025.01); *H10D 62/882* (2025.01); *H10D 86/423* (2025.01)

(58) Field of Classification Search
USPC .......................................................... 257/76
See application file for complete search history.

(56) References Cited

U.S. PATENT DOCUMENTS

| | | | |
|---|---|---|---|
| 9,276,092 B1 | 3/2016 | Karda et al. | |
| 9,276,134 B2 | 3/2016 | Karda et al. | |
| 9,991,122 B2 | 6/2018 | Meade et al. | |
| 10,991,826 B2 | 4/2021 | Ma et al. | |
| 2015/0287942 A1 | 10/2015 | Cao et al. | |
| 2016/0093745 A1 | 3/2016 | Diaz et al. | |
| 2020/0066917 A1 | 2/2020 | Kula et al. | |
| 2020/0251559 A1* | 8/2020 | Liaw ................... | H10D 84/853 |
| 2021/0050443 A1 | 2/2021 | Karda et al. | |
| 2023/0290856 A1 | 9/2023 | Xu et al. | |

OTHER PUBLICATIONS

Christoloveanu et al., "The Concept of Electrostatic Doping and Related Devices", Science Direct, 2019, United Kingdom, 26 pages.
Desai et al, "MoS2 Transistors with 1-Nanometer Gate Lengths", Science vol. 354, Issue 6308, Oct. 7, 2016, United States, pp. 99-102.
Novoselov et al., "Electric Field Effect in Atomically Thin Carbon Films", Science vol. 306, No. 5696, Oct. 22, 2004, United States, 5 pages.
Royal Swedish Academy of Sciences, "Graphene: Scientific Background on the Nobel Prize in Physics 2010", Kungl. Vetenskaps-Akademien, Oct. 5, 2010, Sweden, 10 pages.

* cited by examiner

INTEGRATED ASSEMBLIES AND METHODS
OF FORMING INTEGRATED ASSEMBLIES

RELATED PATENT DATA

This patent resulted from a divisional of U.S. patent application Ser. No. 17/005,054 filed Aug. 27, 2020 which is hereby incorporated by reference herein.

TECHNICAL FIELD

Integrated assemblies (e.g., integrated memory). Methods of forming integrated assemblies.

BACKGROUND

Transistors are utilized in a variety of semiconductor devices. Field effect transistors (FETs) include a channel region between a pair of source/drain regions, and include one or more gates configured to electrically connect the source/drain regions to one another through the channel region.

Vertical FETs (VFETs) have channel regions that are generally perpendicular to a primary surface of a substrate on which the transistors are formed. Polycrystalline silicon is conventionally used as a material of the channel region in the transistors. Two-dimensional-materials have also been investigated for use as the channel material due to their large band gap and good mobility properties compared to polycrystalline silicon.

Growing bulk amounts (e.g., a large area) of two-dimensional-materials may be problematic because the resulting two-dimensional-materials may not exhibit a good quality (e.g., may have crystalline defects). The crystalline defects, such as interstitial and vacancy defects, may detrimentally influence the electrical characteristics of the two-dimensional-materials, and may thus detrimentally influence operability of transistors utilizing the two-dimensional-materials.

It is desired to develop new methods for incorporating two-dimensional-materials into transistor devices. It is also desired to develop improved transistor device configurations utilizing two-dimensional-materials.

DETAILED DESCRIPTION OF THE ILLUSTRATED EMBODIMENTS

Some embodiments include vertical transistors (VFETs) having two-dimensional-material as the active material of the transistors, and having electrostatic-doping-material adjacent to source/drain regions of the active material and utilized to impart desired carrier properties to the source/drain regions.

Some embodiments include methods of utilizing electrostatic-doping-material to impart desired properties to two-dimensional-material of VFETs.

Example embodiments are described with reference to FIGS. 1-13.

Figure 1:
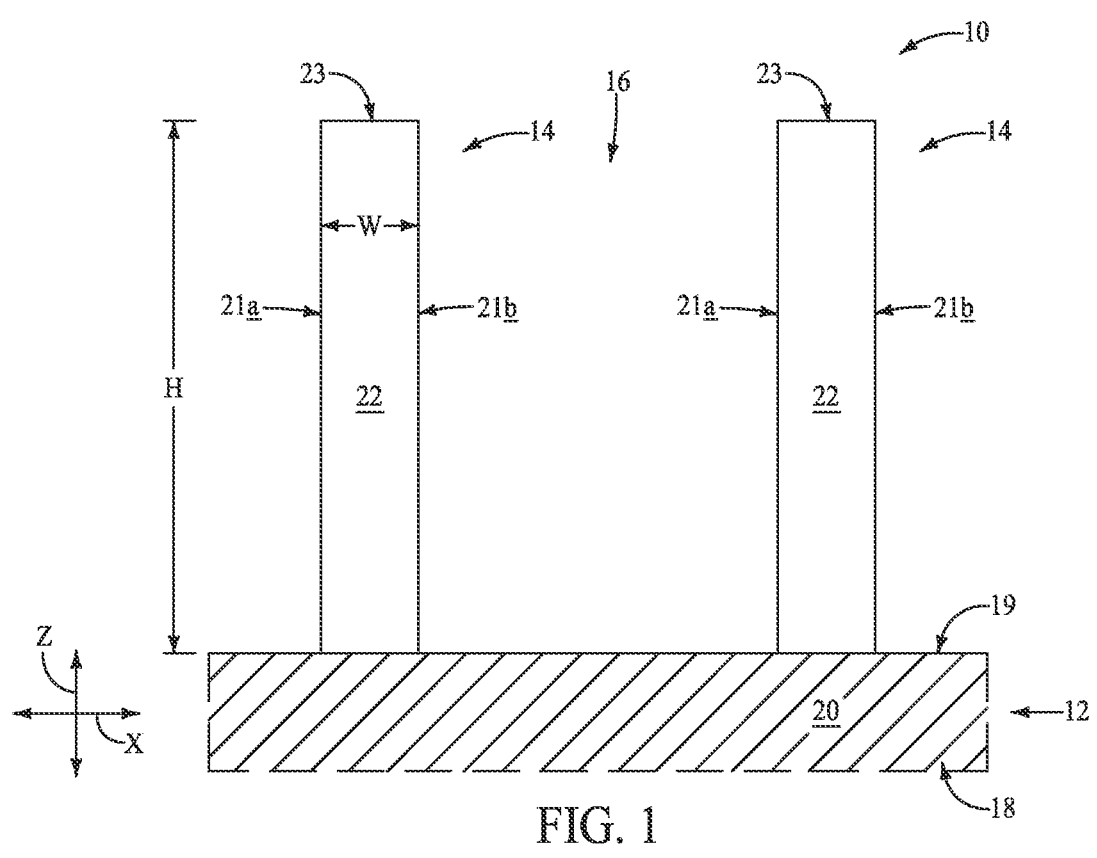
FIGS. 1-9 are diagrammatic cross-sectional side views of a region of an example integrated assembly at example sequential process stages of an example method.

Referring to FIG. 1, an integrated assembly 10 includes a pair of structures (posts, fins, etc.) 14 which are formed to extend upwardly from a substrate 12. Example structures 14 are shown in three-dimensional view in FIG. 13 (discussed below). The structures 14 may be referred to as first structures or as upwardly-extending structures.

In the illustrated embodiment of FIG. 1, the substrate 12 comprises a conductive line 18 which extends along an illustrated x-axis direction (which may also be referred to as a first direction). The conductive line 18 comprises conductive material 20. The conductive material 20 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In some embodiments, the conductive line 18 may correspond to a digit line (bitline, sense line, etc.).

The upwardly-extending structures 14 are spaced from one another along the x-axis direction. A gap 16 is between the spaced-apart structures 14.

The structures 14 comprise insulative material 22. Such insulative material may comprise any suitable composition(s), and in some embodiments may comprise, consist essentially of, or consist of one or more of silicon dioxide, silicon nitride, aluminum oxide, hafnium oxide, zirconium oxide, etc.

Each of the structures 14 comprises a pair of sidewalls surfaces 21a and 21b along the cross-section of FIG. 1, and comprises a top surface 23 extending between the sidewall surfaces 21a and 21b. In some embodiments, the sidewall surfaces 21a may be referred to as first sidewall surfaces, and the sidewall surfaces 21b may be referred to as second sidewall surfaces which are laterally disposed relative to the first sidewall surfaces.

The conductive line 18 comprises a horizontally-extending upper surface 19.

The upwardly-extending structures 14 extend along an illustrated z-axis direction, and accordingly extend orthogonally (or at least substantially orthogonally) relative to the horizontally-extending upper surface 19. The term "substantially orthogonally" means orthogonally to within reasonable tolerances of fabrication and measurement.

The upwardly-extending structures 14 may be considered to extend vertically, or at least substantially vertically. In some embodiments, the structures 14 may extend at an angle of about 90° (i.e., 90°±10°) relative to the horizontally-extending surface 19.

The structures 14 may comprise any suitable dimensions. In some embodiments, the structures may comprise heights, H, within a range of from about 10 nanometers (nm) to about 1000 nm, within a range of from about 10 nm to about 100 nm, etc.; and may comprise widths, W, within a range of from about 2 nm to about 200 nm, within a range of from about 2 nm to about 100 nm, etc.

The conductive line 18 may be supported over a semiconductor-containing base (not shown). The base may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Figure 2:
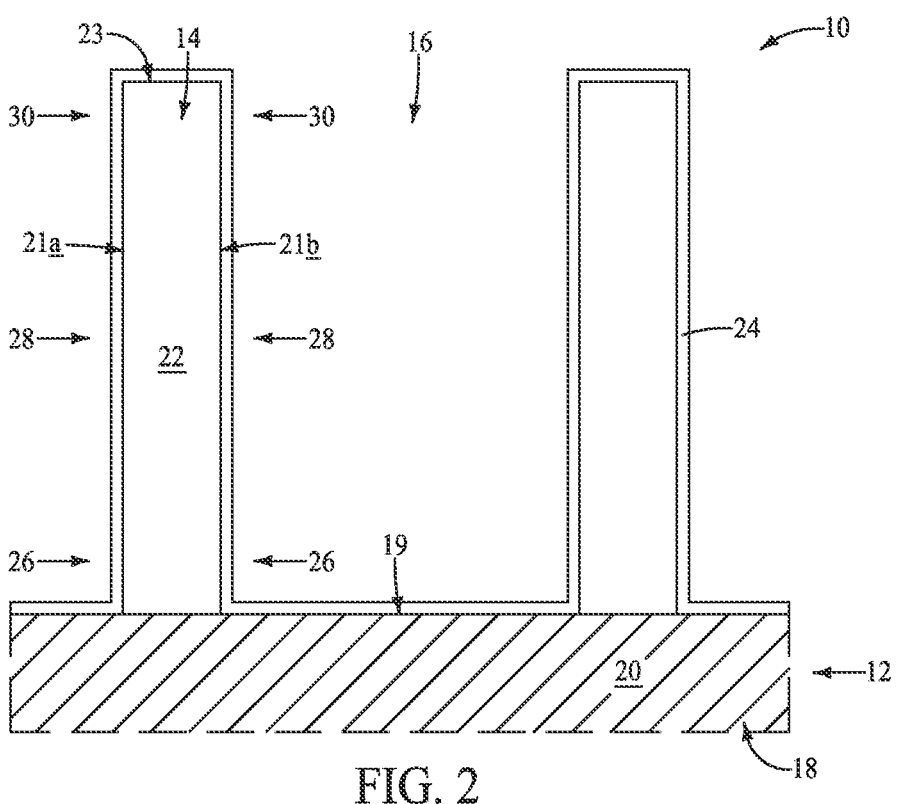

Referring to FIG. 2, two-dimensional-material 24 is formed along outer peripheries of the structures 14, and is formed along the upper surface 19 of the conductive material 20 within the gap 16. The two-dimensional-material 24 along the outer peripheries of the structures extends along the upper surfaces (top surfaces) 23 of the structures, and extends along the sidewall surfaces 21*a* and 21*b* of the structures. In the illustrated embodiment, the two-dimensional-material 24 is formed directly against the upper surface 19 of the conductive material 20 of the conductive line 18, and is formed directly against the surfaces 21 and 23 of the insulative material 22 of the structures 14.

The two-dimensional-material 24 along the sidewall surfaces 21*a* and 21*b* may be considered to comprise lower regions 26, upper regions 30, and central regions 28 between the upper and lower regions.

The two-dimensional-material 24 may be formed with any suitable processing, including, for example, one or more of atomic layer deposition (ALD), chemical vapor deposition (CVD), physical vapor deposition (PVD), etc.

The term "two-dimensional-material" refers to a material having one or more layers with stronger forces within each layer (ionic, covalent, etc.) than along edges of the layers (e.g., between adjacent layers). The forces along edges of the layers (e.g., between adjacent layers) will generally be predominantly van der Waals forces. The two-dimensional-material 24 may comprise any suitable number of layers; and in some embodiments may comprise a stack having 1 to 10 separate layers. The two-dimensional-material 24 may have any suitable thickness, and in some embodiments may have a thickness within a range of from about 0.5 nm to about 5 nm.

The two-dimensional-material 24 may comprise any suitable composition(s); and in some embodiments may comprise one or more of carbon, boron, germanium, silicon, tin, phosphorus, bismuth, indium, molybdenum, platinum, rhenium, tungsten and hafnium. In specific applications, the two-dimensional-material 24 may comprise one or more of graphene, graphyne, borophene, germanene, silicene, $Si_2BN$, stanene, phosphorene, bismuthene, molybdenum disulfide, molybdenum diselenide, tungsten disulfide, tungsten diselenide, tin disulfide, rhenium disulfide, indium disulfide, and hafnium disulfide. In some embodiments, the two-dimensional-material 24 may comprise transition metal dichalcogenide (TMDC). The TMDC has the chemical formula MX, such as $MX_2$, where M is a transition metal and X is a chalcogen (e.g., sulfur, selenium, tellurium, etc.). The transition metal may include, but is not limited to, molybdenum, tungsten, niobium, zirconium, hafnium, rhenium, platinum, titanium, tantalum, vanadium, cobalt, cadmium, chromium, etc.

The two-dimensional-material may be entirely monocrystalline, or may be at least substantially entirely monocrystalline. The term "substantially entirely monocrystalline" means that the material is greater than or equal to about 95% monocrystalline, by volume.

Figure 3:
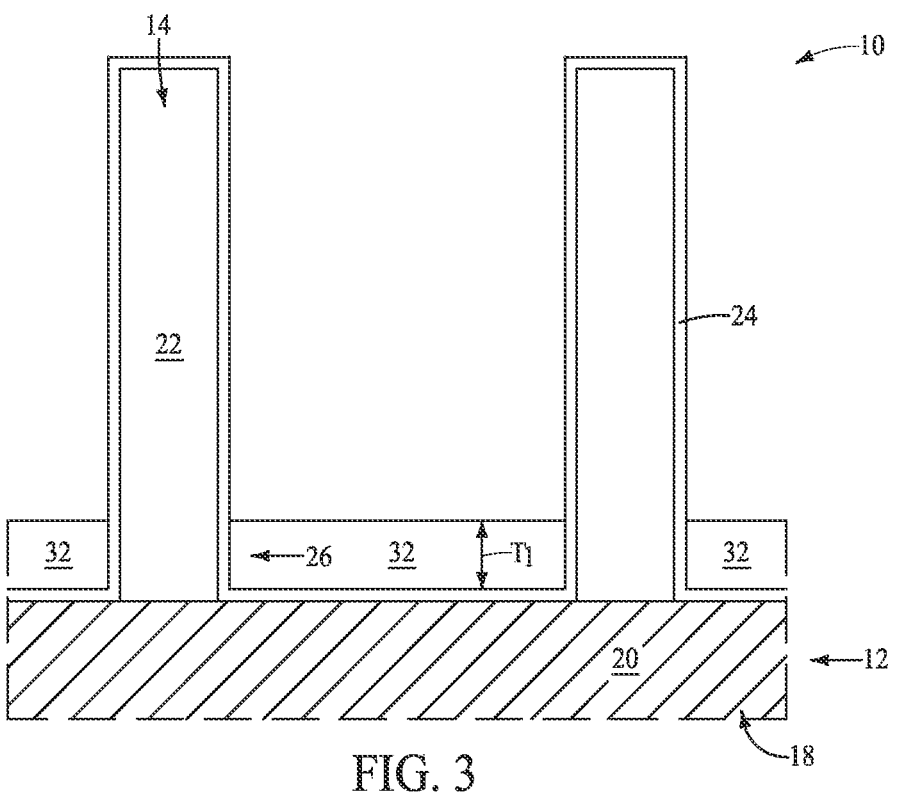

Referring to FIG. 3, electrostatic-doping-material 32 is formed over the conductive line 18 and adjacent to the lower regions 26 of the two-dimensional-material 24 along the structures 14. The electrostatic-doping-material 32 may be formed with any suitable processing, including, for example, one or more of ALD, CVD, PVD; and may be formed to any suitable thickness $T_1$. In some example embodiments, the thickness $T_1$ may be within a range of from about 1 nm to about 200 nm, within a range of from about 1 nm to about 100 nm, within a range of from about 1 nm to about 50 nm, etc.

The electrostatic-doping-material 32 comprises a composition which imparts desired carrier behavior to the adjacent regions of the two-dimensional-material 24. For instance, the electrostatic-doping-material 32 may be configured to impart positive charge to the adjacent regions of the two-dimensional-material 24 and to thereby create n-type behavior within such adjacent regions, or to impart negative charge to the adjacent regions of the two-dimensional-material and to thereby create p-type behavior within such adjacent regions. In some embodiments, the material 32 may comprise one or more of zirconium oxide, aluminum oxide, silicon nitride and silicon oxynitride. Alternatively considered, the material 32 may comprise one or more of AlO, SiN, ZrO and SiON, where the chemical formulas indicate primary constituents rather than specific stoichiometries. In some embodiments, the silicon nitride and/or silicon oxynitride may provide trapped charge along an interface with the two-dimensional-material 24 to thereby generate n-type behavior within the material. The AlO may provide either positive charge or negative charge along the interface with the two-dimensional-material 24 depending on the composition of the AlO, and may thereby generate either p-type behavior or n-type to behavior within the material 24.

Figure 3A:
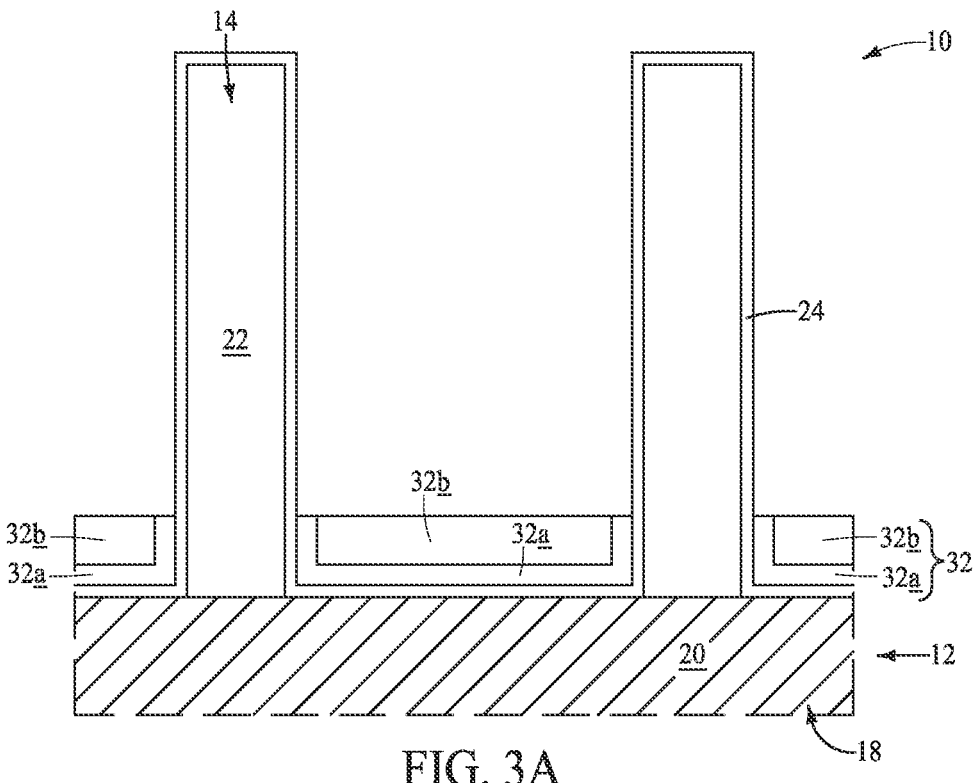
FIG. 3A is a diagrammatic cross-sectional side view of a region of an example integrated assembly at an example process stage analogous to that of FIG. 3.

The specific behavior induced within the material 24 may be tailored by engineering the physical and/or chemical properties of the electrostatic-doping-material. For instance, FIG. 3A shows an embodiment in which the material 32 comprises two compositions 32*a* and 32*b*. The compositions 32*a* and 32*b* may comprise the same primary constituents as one another, but may vary relative to concentrations of particular chemical species (e.g., both may comprise AlO, with the oxygen concentration being different within the composition 32*a* than the composition 32*b*), or may comprise different chemical constituents relative to one another (e.g., one of the compositions 32*a* and 32*b* may comprise aluminum oxide while the other comprises silicon nitride). Although FIG. 3A shows the material 32 comprising two different compositions, in other embodiments the material 32 may comprise more than two different compositions.

Figure 4:
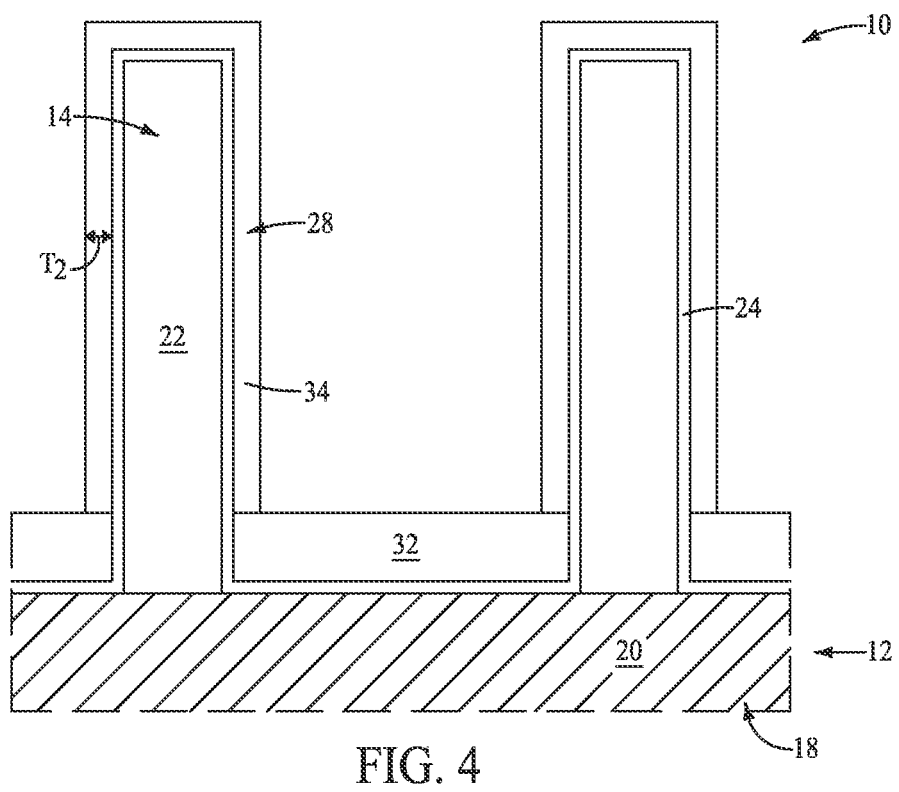

Referring to FIG. 4, insulative material 34 is formed over the structures 14, and along an upper surface of the electrostatic-doping-material 32. The insulative material 34 may ultimately comprise gate-dielectric-material of transistor devices, and may comprise any suitable composition(s). In some embodiments, the insulative material 34 may comprise one or more of silicon dioxide, aluminum oxide, hafnium oxide, etc.

The insulative material 34 may be formed to any suitable thickness, $T_2$, and in some embodiments may be formed to a thickness within a range of from about 2 nm to about 10 nm.

In some embodiments, the insulative material 22 of the structures 14 may be referred to as a first insulative material, and the insulative material 34 may be referred to as a second insulative material.

The insulative material 34 extends across the central regions 28 of the structures 14. In some embodiments, regions of the insulative material 34 may be considered to be adjacent the central regions 28 of the structures 14.

Figure 5:
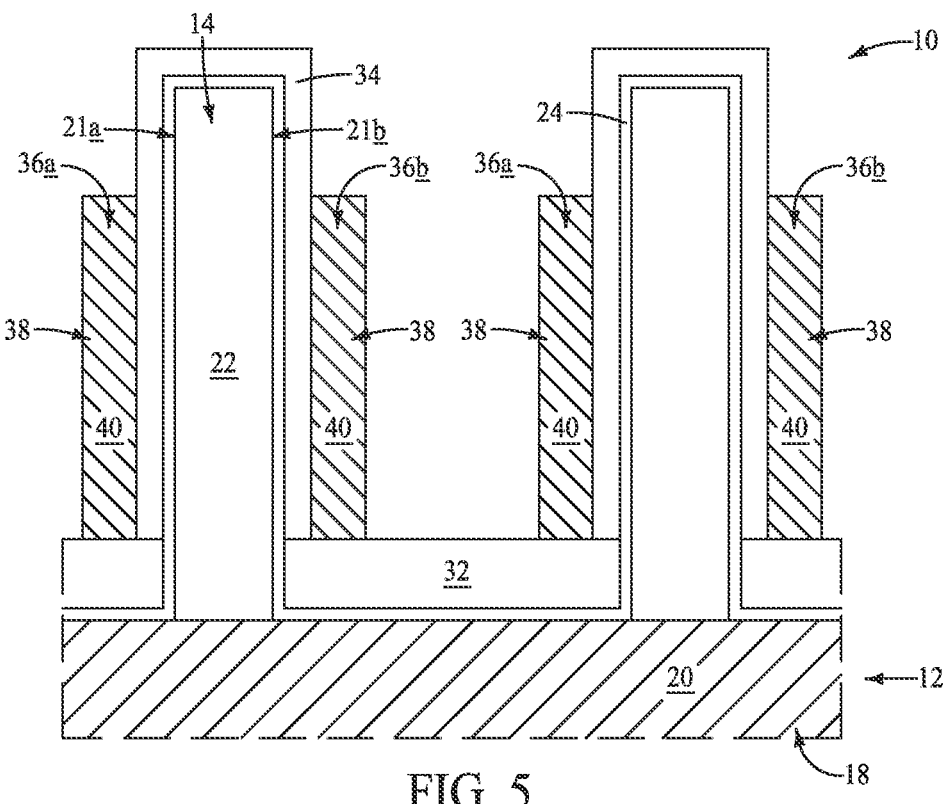

Referring to FIG. 5, conductive structures 36 are formed over the electrostatic-doping-material 32 and adjacent the insulative material 34. Two of the conductive structures 36 are provided adjacent each of the structures 14. One of the conductive structures adjacent to a structure may be referred to as a first conductive structure 36a, and the other may be referred to as a second conductive structure 36b. The conductive structures 36a are adjacent to the sidewalls 21a of the structures 14, and the conductive structures 36b are adjacent to the sidewalls 21b.

The structures 36 may be referred to as conductive-gate-structures, and may be comprised by wordlines (access lines) 38 that extend in and out of the page relative to the view of FIG. 5. In some embodiments, the conductive line 18 (which may be a digit line) may be referred to as a first conductive line, and the conductive lines 38 (which may be wordlines) may be referred to as second conductive lines.

The conductive structures 36 comprise conductive material 40. The conductive material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive materials 20 and 40 (e.g., the conductive materials of the digit line structures 18 and the wordline structures 38) may be the same composition as one another, and in other embodiments the conductive materials 20 and 40 may comprise different compositions relative to one another.

Figures 6, 7:
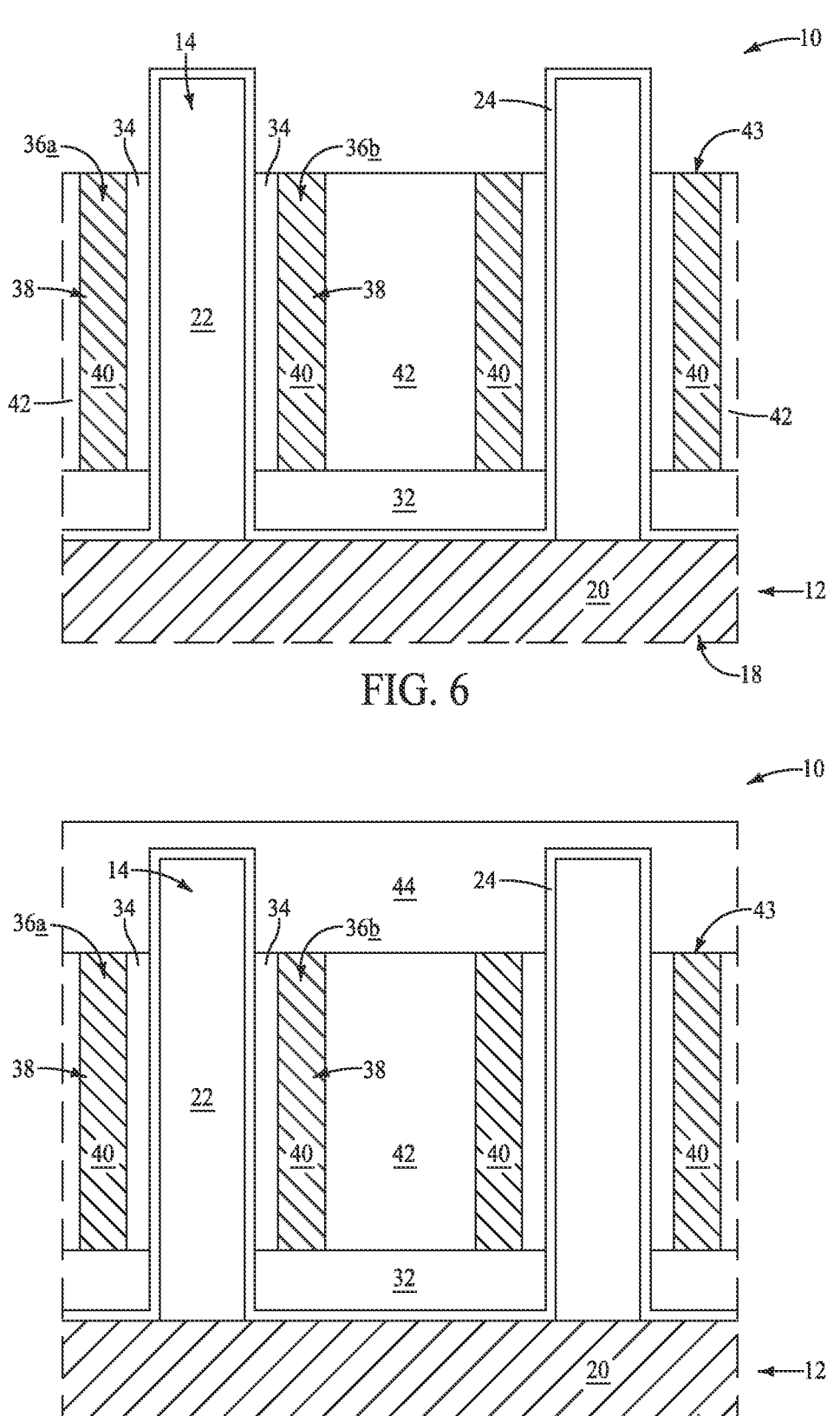

Referring to FIG. 6, insulative material 42 is formed between the conductive structures 36. The insulative material 42 may comprise any suitable composition(s), and in some embodiments may comprise, consist essentially of, or consist of silicon dioxide.

A substantially planar surface 43 is formed to extend across the materials 34, 40 and 42. The surface 43 may be formed with suitable etching and/or other processing.

Referring to FIG. 7, electrostatic-doping-material 44 is formed over the surface 43, and over the structures 14. The electrostatic-doping-material 44 may be referred to as a second electrostatic-doping-material to distinguish it from the first electrostatic-doping-material 32 formed at the process stage of FIG. 3.

The electrostatic-doping-material 44 may comprise any of the compositions described above as being suitable for the electrostatic-doping-material 32. The first and second electrostatic-doping-materials 32 and 44 may comprise the same composition as one another, or may comprise different compositions relative to one another.

In the illustrated embodiment, the electrostatic-doping-material 44 may be considered to be formed over the conductive-gate-structures 36, and over the insulative materials 34 and 42.

Figures 8, 9:
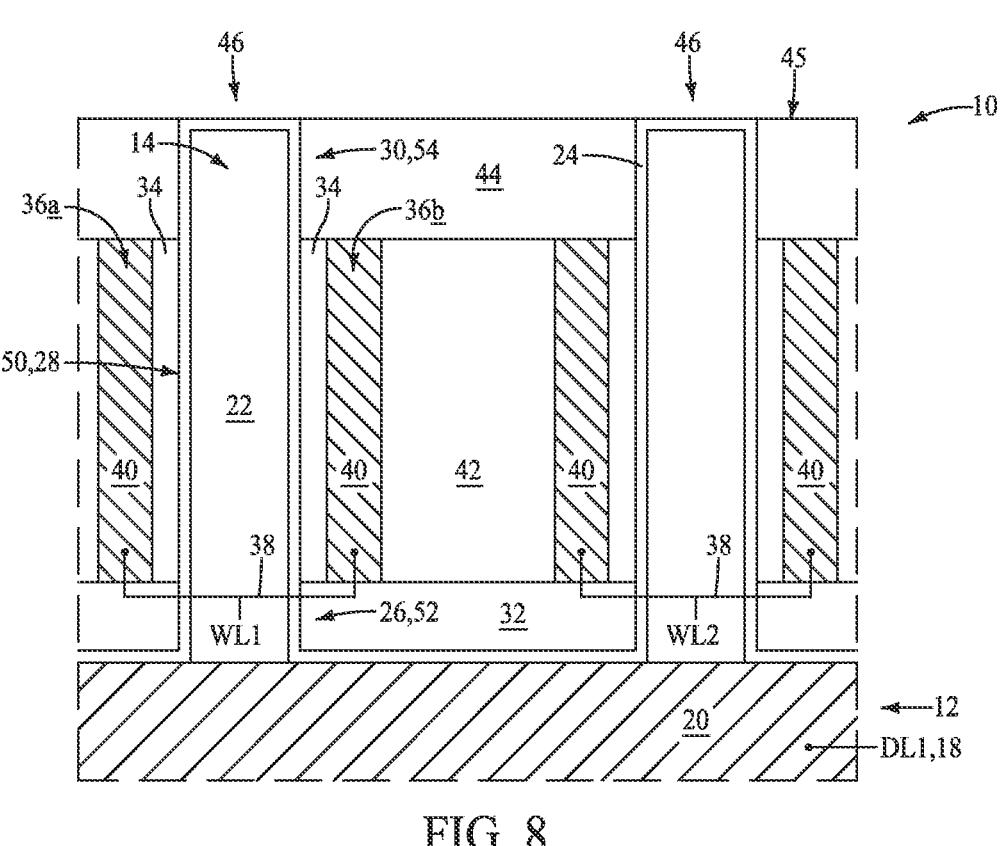

Referring to FIG. 8, a planarized surface 45 is formed to extend across the materials 24 and 44. The planarized surface 45 may be formed with any suitable processing, including, for example, chemical-mechanical polishing (CMP), one or more suitable etches, etc.

The remaining electrostatic-doping-material 44 is adjacent the upper regions 30 of the two-dimensional-material 24 along the structures 14.

The conductive line 18 of FIG. 8 is shown to correspond to a digit line (DL1), and the conductive lines 38 are shown to be incorporated into wordlines (WL1 and WL2). The two-dimensional-material 24 along the structures 14 becomes active material within transistors (access devices) 46. Each of the access devices includes upper and lower regions 26 and 30 of the two-dimensional-material 24 corresponding to source/drain regions 52 and 54, and comprises a central region 28 of the two-dimensional-material 24 corresponding to a channel region 50. The carrier behavior (i.e., n-type behavior or p-type behavior) of the source/drain regions 52 and 54 is determined by the influence of the electrostatic-doping-materials 32 and 44 on the upper and lower regions 26 and 30 of the two-dimensional-material 24.

The transistors 46 may be incorporated into a memory array. For instance, FIG. 9 shows storage elements 56 electrically coupled with the upper source/drain regions 54 of the transistors 46. The storage-elements 56 may be any suitable devices having at least two detectable states; and in some embodiments may be, for example, capacitors, resistive-memory devices, conductive-bridging devices, phase-change-memory (PCM) devices, programmable metallization cells (PMCs), etc. If the storage elements are capacitors, they may be either ferroelectric capacitors (i.e., may comprise ferroelectric insulative material between a pair of capacitor electrodes) or may be non-ferroelectric capacitors (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

Figure 9A:
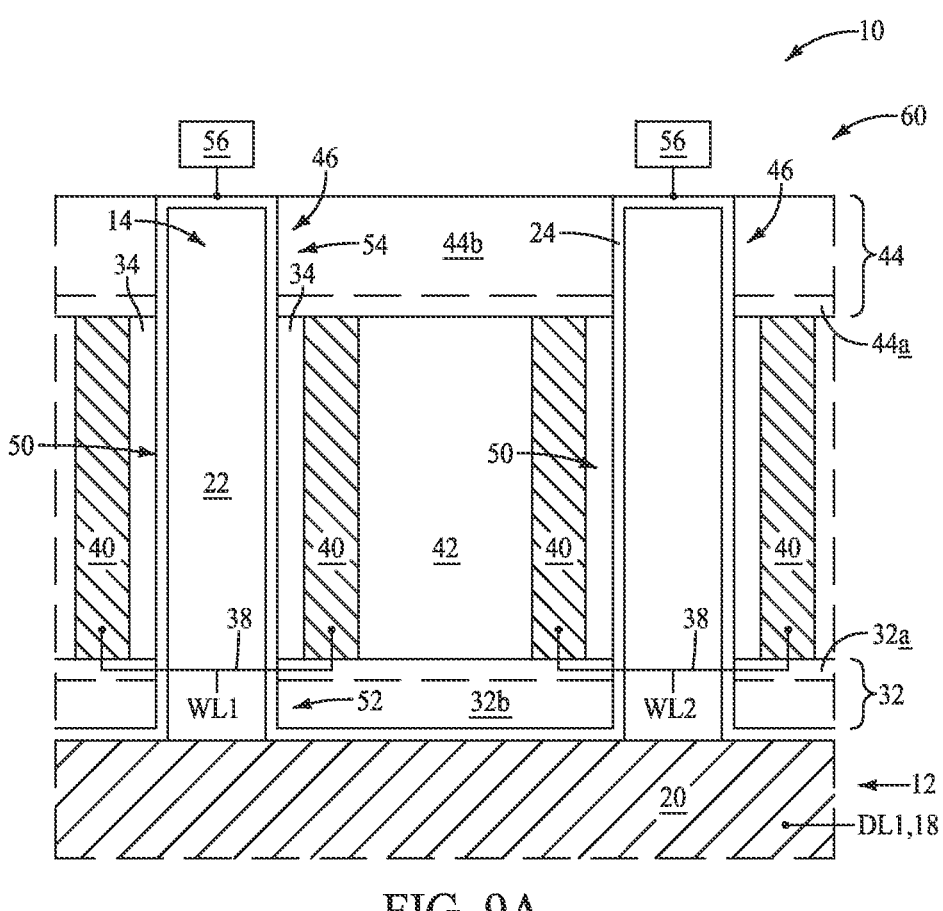
FIG. 9A is a diagrammatic cross-sectional side view of a region of an example integrated assembly at an example process stage analogous to that of FIG. 9.

Although FIG. 9 shows the electrostatic-doping-materials 32 and 44 as being homogeneous, it is to be understood that in other embodiments one or both of such materials may be heterogeneous (as discussed above with reference to FIG. 3A). FIG. 9A shows an example embodiment in which the materials 32 and 44 are heterogeneous, and comprise gradients between first compositions 32a and 44a, and second compositions 32b and 44b. The gradients are diagrammatically illustrated by providing dashed lines between the compositions 32a and 32b, and between the compositions 44a and 44b. The heterogeneous electrostatic-doping-materials 32 and 44 may be utilized to impart gradients to the source/drain regions 52 and 54. For instance, they may be utilized to impart regions within the two-dimensional-material 24 having behavior corresponding to lightly-doped-diffusion regions, and to impart adjacent regions within the two-dimensional-material 24 having behavior corresponding to heavily-doped (highly conductive) regions.

Although both of the electrostatic-doping-regions 32 and 44 are shown to comprise two different compositions in the embodiment of FIG. 9A, in other embodiments one of the electrostatic-doping-regions may comprise two or more different compositions while the other of the electrostatic-doping-regions comprises only a single composition.

The embodiments of FIGS. 9 and 9A may be considered to show asymmetric vertical transistor devices in that the upper source/drain regions 54 are vertically thicker than the lower source/drain regions 52. The vertical transistor devices may also be asymmetric due to, for example, the upper electrostatic-doping-material 44 having a different composition than the lower electrostatic-doping-material 32 causing the upper source/drain regions 54 to have different behavior than the lower source/drain regions 52. In other embodiments (not shown), the vertical transistor devices may be symmetric (i.e., the upper and lower source/drain regions 54 and 52 may have the same composition and thickness as one another).

Figure 10:
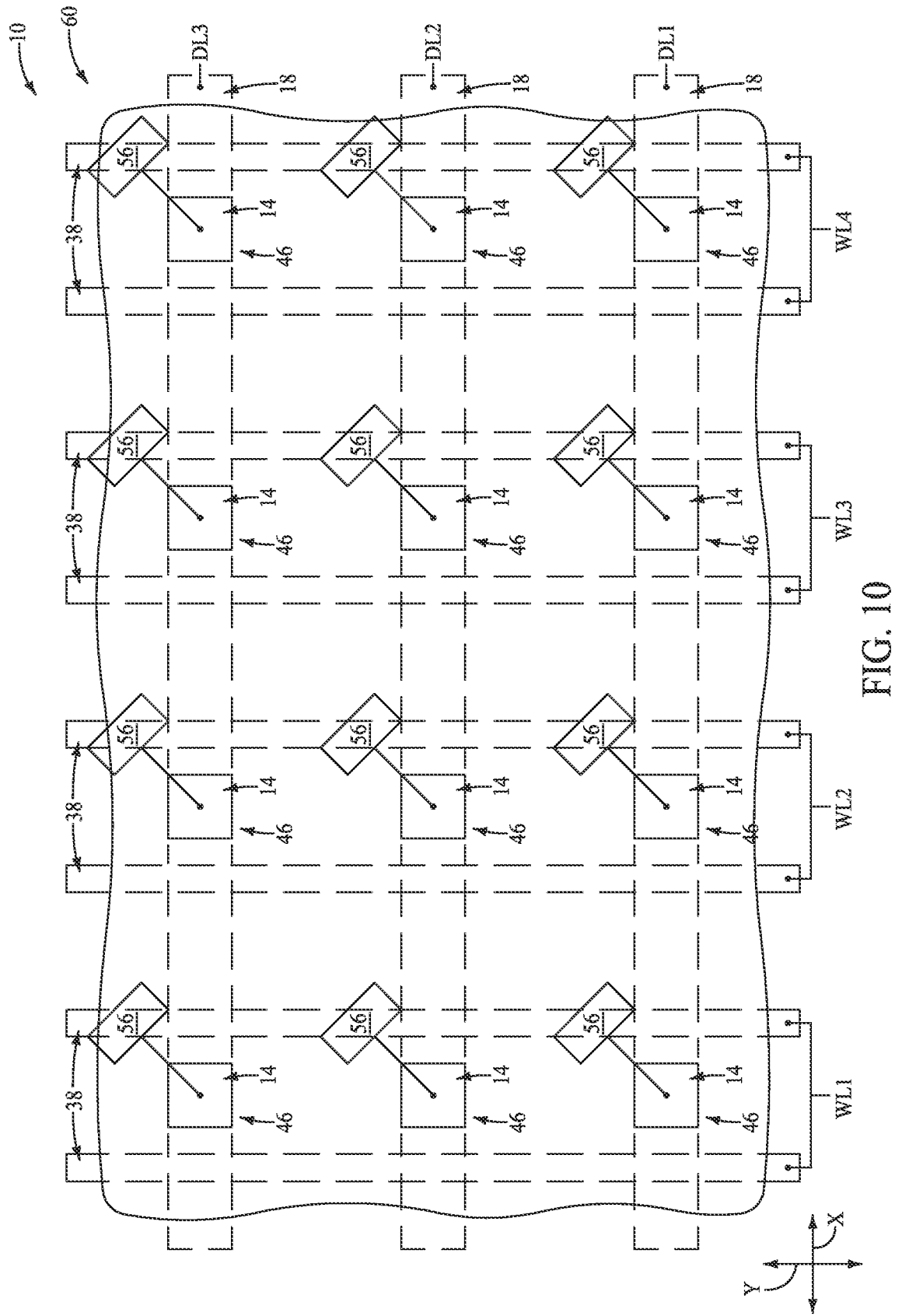
FIG. 10 is a diagrammatic top-down view of a region of an example integrated assembly at the process stage of FIG. 9.

The storage elements 56 of FIGS. 9 and 9A may be incorporated into memory arrays 60. FIG. 10 shows a view of a region of an integrated assembly 10 comprising an example memory array 60. The conductive lines 38 and 18 are shown in dashed-line view to indicate that they are beneath other materials. Paired lines 38 are coupled with another to form wordlines WL1-WL4.

The digit lines DL1-DL3 extend along a first direction corresponding to an illustrated x-axis direction, and the wordlines WL1-WL4 extend along a second direction corresponding to an illustrated y-axis direction. The second direction of the wordlines crosses the first direction of the digit lines. In the shown embodiment, the second direction of the wordlines is orthogonal to (or at least substantially orthogonal to) the first direction of the digit lines, with the term "substantially orthogonal" meaning orthogonal to within reasonable tolerances of fabrication and measurement. In other embodiments, the wordlines may cross the digit lines at other angles.

The wordlines (e.g., WL1) and digit lines (e.g., DL1) are shown to be substantially straight. In other embodiments, the wordlines and/or the digit lines may be curved, wavy, etc.

FIG. 10 shows an embodiment in which the structures 14 are configured as posts. Such posts are polygonal (specifically, square-shaped) in top-down view. In other embodiments the posts may have other shapes in top-down view, including, for example, circular shapes, elliptical shapes, etc. Alternatively, the structures 14 may be fins, as described below with reference to FIG. 13.

FIG. 9 shows an embodiment in which the two-dimensional-material 24 is continuous across the tops of the pillars 14. In other embodiments the two-dimensional-material 24 may be broken at the tops of the pillars 14, as shown in FIG. 11.

Figure 11:
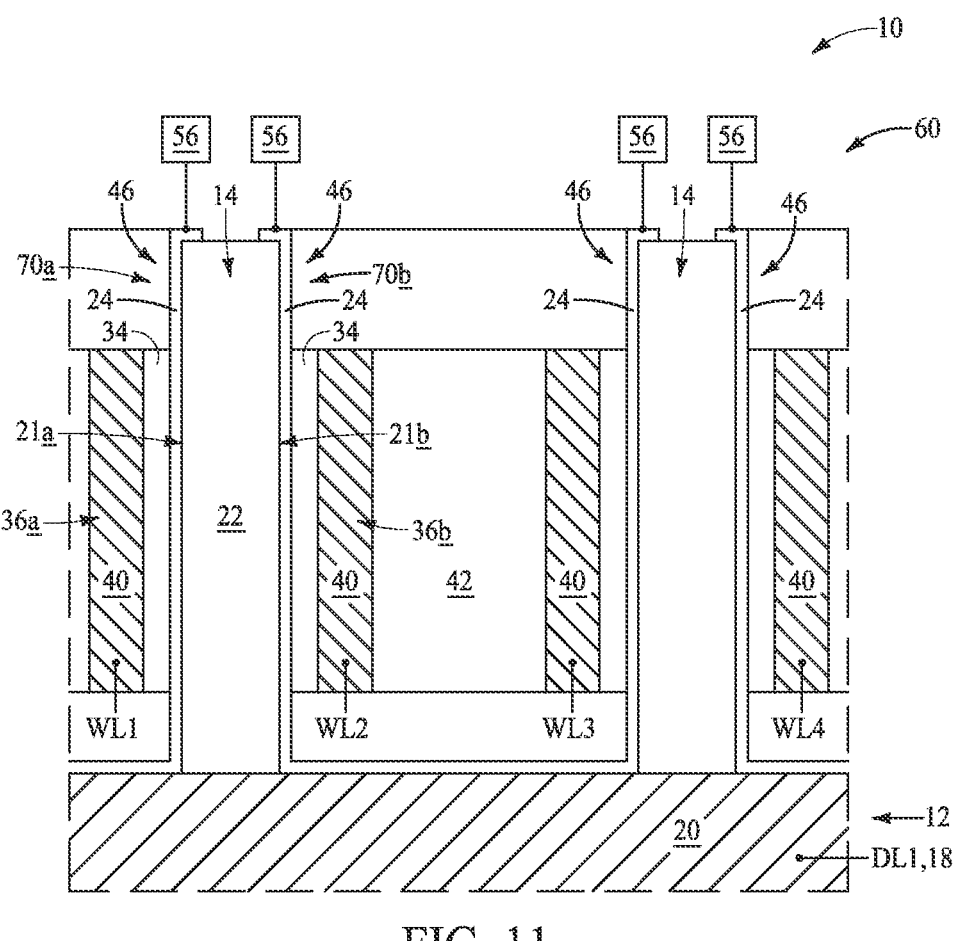
FIG. 11 is a diagrammatic cross-sectional side view of a region of an example integrated assembly at an example process stage alternative to that of FIG. 9.

In the embodiment of FIG. 11, the two-dimensional-material 24 along the sidewall surface 21a of a pillar 14 is physically separated from the two-dimensional-material 24 along the sidewall surface 21b of the pillar 14. The two-dimensional-materials 24 along the opposing surfaces 21a and 21b are thus incorporated into two different transistors 46 in the embodiment of FIG. 11, and the conductive structures 36a and 36b are incorporated into two different wordlines (WL1 and WL2). In some embodiments, the two-dimensional-material 24 along the sidewall surface 21a may be referred to as a first vertically-extending-two-dimensional-material-structure and the two-dimensional-material 24 along the sidewall surfaces 21b may be referred to as a second vertically-extending-two-dimensional-material-structure 70b.

Figure 12:
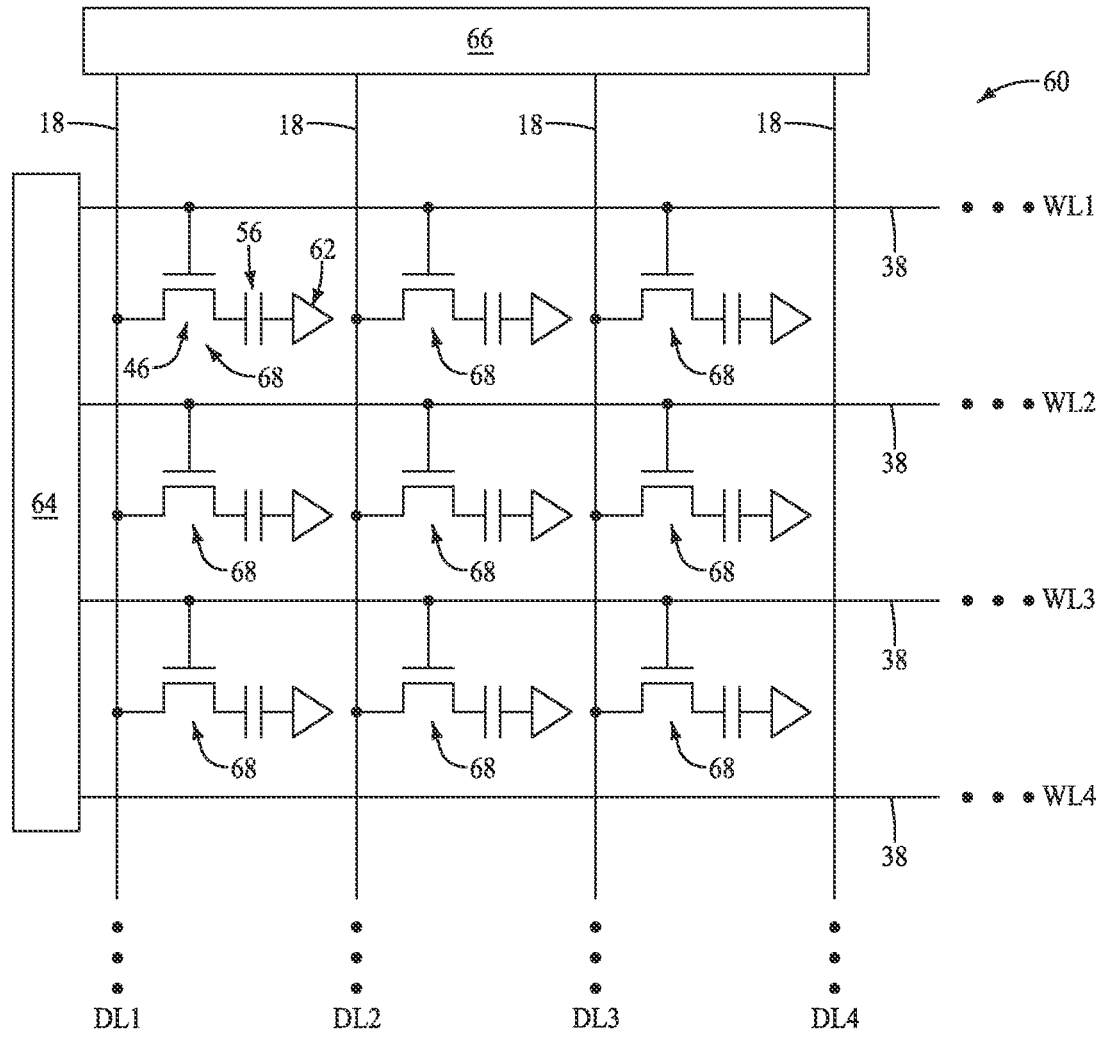
FIG. 12 is a diagrammatic schematic view of a region of an example memory array.

The memory arrays 60 described above may have any suitable configurations. FIG. 12 shows an example configuration in which the storage elements 56 are capacitors. The capacitors may be non-ferroelectric capacitors, and accordingly the memory array 60 may be a dynamic random access memory (DRAM) array. Alternatively, the capacitors may be ferroelectric capacitors, and accordingly the memory array 60 may be a ferroelectric random access memory (FeRAM) array.

The illustrated capacitors 56 have an electrical node coupled with an access transistor 46, and have another electrical node coupled with a reference 62. The reference 62 may correspond to any suitable reference voltage, including, ground, VCC/2, etc.

The wordlines 38 are shown coupled with wordline-driver-circuitry 64, and the digit lines 18 are shown coupled with sense-amplifier-circuitry 66. The access transistors 46 and storage elements 56 together form memory cells 68, with each of the memory cells being uniquely addressed by one of the digit lines 18 in combination with one of the wordlines 38.

Figure 13:
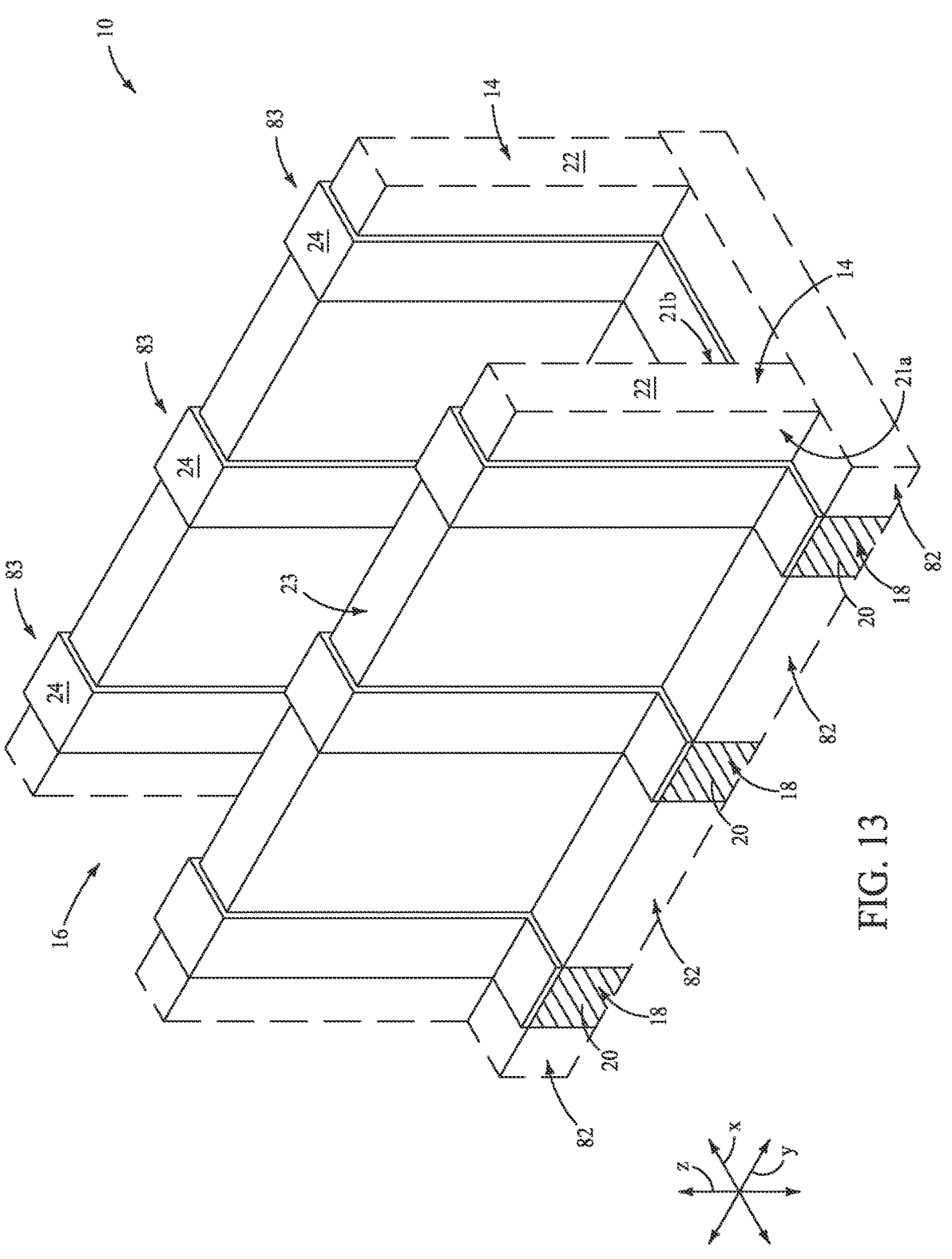
FIG. 13 is a diagrammatic three-dimensional view of a region of an example integrated assembly at a process stage analogous to the process stage of FIG. 2.

FIG. 13 shows an assembly 10 similar to the assembly described above with reference to FIG. 2. The conductive lines (digit lines) 18 are spaced from one another by intervening insulative material 82. The insulative material 82 may comprise any suitable composition(s), and in some embodiments may comprise, consist essentially of, or consist of silicon dioxide. The insulative material 82 may or may not comprise the same material as the structures 14. In the illustrated embodiment of FIG. 13, the structures 14 are fins (rails) which extend substantially orthogonally to the digit lines 18. The two-dimensional material 24 extends over and between the fins 14, and is configured as spaced-apart strips (stripes) 83.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an upwardly-extending structure which includes a first insulative material. The upwardly-extending structure has a pair of sidewall surfaces along a cross-section, and has a top surface extending between the sidewall surfaces. One of the sidewall surfaces is a first sidewall surface and the other of the sidewall surfaces is a second sidewall surface. Two-dimensional-material is adjacent the first sidewall surface and extends along the first sidewall surface. The two-dimensional-material has a lower region, an upper region, and a central region between the upper and lower regions. First electrostatic-doping-material is adjacent the lower region of the two-dimensional-material. Second insulative material is adjacent the central region of the two-dimensional-material and on an opposing side of the two-dimensional-material from the first sidewall surface of the upwardly-extending structure. A conductive-gate-structure is over the first electrostatic-doping-material, adjacent the second insulative material, and proximate the central region of the two-dimensional-material. Second electrostatic-doping-material is over the conductive-gate-structure and adjacent the upper region of the two-dimensional-material.

Some embodiments include an integrated assembly having first conductive lines extending along a first direction, and having structures extending upwardly from the first conductive lines. The structures comprise first insulative material, and are spaced from one another by gaps along the first direction. Two-dimensional-material extends along upper surfaces of the first conductive lines within the gaps, and along outer peripheries of the structures. First electrostatic-doping-material is over the first conductive lines and adjacent lower regions of the two-dimensional-material adjacent the structures. Second insulative material is over the first electrostatic-doping-material and adjacent central regions of the two-dimensional-material adjacent the structures. Second conductive lines extend along a second direction which crosses the first direction. The second conductive lines are over the first electrostatic-doping-material and are adjacent the second insulative material. A second electrostatic-doping-material is over the second conductive lines and is over the second insulative material. The second electrostatic-doping-material is adjacent upper regions of the two-dimensional-material adjacent the structures. Storage elements are electrically coupled with the upper region of the two-dimensional-material.

Some embodiments include a method of forming an integrated assembly. First structures are formed to extend upwardly from a substrate. The first structures are spaced from one another by gaps along a first direction. Two-dimensional-material is formed along an upper surface of the substrate within the gaps, and along outer peripheries of the first structures. First electrostatic-doping-material is formed over the substrate and adjacent lower regions of the two-dimensional-material adjacent the first structures. Insulative material is formed over the first electrostatic-doping-material and adjacent central regions of the two-dimensional-material adjacent the first structures. A conductive-gate-structure is formed over the first electrostatic-doping-material and adjacent the insulative material. Second electrostatic-doping-material is formed over the conductive-gate-structure and over the second insulative material. The second electrostatic-doping-material is adjacent upper regions of the two-dimensional-material adjacent the first structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:

forming structures extending upwardly from a substrate; the first structures being spaced from one another by gaps along a first direction;

forming two-dimensional-material along an upper surface of the substrate within the gaps, and along sidewalls around the outer peripheries of the structures;

forming first electrostatic-doping-material over the substrate and in direct physical contact with lower regions of the sidewalls of the two-dimensional-material adjacent the first structures;

forming insulative material over the first electrostatic-doping-material and in direct physical contact with central regions of the sidewalls of the two-dimensional-material adjacent the structures;

forming a conductive-gate-structure over the first electrostatic-doping-material and adjacent the insulative material; and forming second electrostatic-doping-material over the conductive-gate-structure and over the insulative material, the second electrostatic-doping-material being in direct physical contact with upper regions of the sidewalls of the two-dimensional-material adjacent the structures.

2. The method of claim 1 wherein the substrate includes a conductive structure, and wherein the two-dimensional-material is formed directly against an upper surface of the conductive structure.

3. The method of claim 2 wherein the conductive structure is a digit line, and wherein the conductive-gate-structure is part of a wordline.

4. The method of claim 3 further comprising forming storage elements coupled with the upper regions of the two-dimensional-material.

5. The method of claim 1 wherein the structures comprise silicon dioxide.

6. The method of claim 1 wherein the first and second electrostatic-doping-materials each comprise one or more of AlO, SiN, ZrO and SiON, where the chemical formulas indicate primary constituents rather than specific stoichiometries.

7. The method of claim 1 wherein the two-dimensional-material comprises one or more of graphene, graphyne, borophene, germanene, silicene, Si₂BN, stanene, phosphorene, bismuthene, molybdenum disulfide, molybdenum diselenide, tungsten disulfide, tungsten diselenide, tin disulfide, rhenium disulfide, indium disulfide, and hafnium disulfide.

8. The method of claim 1 wherein the two-dimensional-material is substantially entirely monocrystalline.

9. A method of forming an integrated assembly, comprising:

forming an upwardly-extending pillar structure that extends upwardly relative to an upper surface of a substrate, the upwardly-extending structure having a pair of vertical sidewall surfaces along a cross-section, and having a top surface extending between the vertical sidewall surfaces; one of the vertical sidewall surfaces being a first vertical sidewall surface and the other of the vertical sidewall surfaces being a second vertical sidewall surface, an entirety of the upwardly-extending pillar structure consisting of one or more insulative materials;

forming a two-dimensional-material in direct physical contact with adjacent the first vertical sidewall surface and extending along an entirety of the first vertical sidewall surface; the two-dimensional-material having a lower sidewall region, an upper vertical sidewall region, and a central vertical sidewall region between the upper and lower vertical sidewall regions;

forming a first electrostatic-doping-material in direct physical contact with adjacent the lower vertical sidewall region of the two-dimensional-material;

forming a second insulative material in direct physical contact with adjacent the central vertical sidewall region of the two-dimensional-material and on an opposing side of the two-dimensional-material from the first vertical sidewall surface of the upwardly-extending pillar structure;

forming a conductive-gate-structure over the first electrostatic-doping-material, adjacent the second insulative material, and proximate the central region of the two-dimensional-material; and forming a second electrostatic-doping-material over the conductive-gate-structure and in direct physical contact with adjacent the upper vertical sidewall region of the two-dimensional-material.

10. The method of claim 9 wherein the first and second electrostatic-doping-materials are compositionally the same as one another.

11. The method of claim 9 wherein the first and second electrostatic-doping-materials are compositionally different from one another.

12. The method of claim 9 wherein the first and second electrostatic-doping-materials each comprise one or more of AlO, SiN, ZrO and SiON, where the chemical formulas indicate primary constituents rather than specific stoichiometries.

13. The method of claim 9 wherein at least one of the first and second electrostatic-doping-materials comprises two different compositions and a gradient between the two different compositions.

14. The method of claim 9 wherein the two-dimensional-material extends along the first and second vertical sidewall surfaces and across the top surface of the upwardly-extending pillar structure.

15. The method of claim 14 wherein the conductive-gate-structure is a first conductive-gate-structure, and further comprising forming a second conductive-gate-structure on an opposing side of the upwardly-extending pillar structure from the first conductive-gate-structure; the first and second conductive-gate-structures being electrically coupled to one another.

16. The method of claim 9 wherein the two-dimensional-material comprises one or more of carbon, boron, germanium, silicon, phosphorus, bismuth, indium, molybdenum, platinum, rhenium, tin, tungsten and hafnium.

17. The method of claim 9 wherein the two-dimensional-material comprises one or more of graphene, graphyne, borophene, germanene, silicene, Si₂BN, stanene, phosphorene, bismuthene, molybdenum disulfide, molybdenum diselenide, tungsten disulfide, tungsten diselenide, tin disulfide, rhenium disulfide, indium disulfide, and hafnium disulfide.

18. The method of claim 9 wherein the two-dimensional-material comprises a stack consisting of 1 to 10 separate layers.

19. The method of claim 9 wherein the two-dimensional-material comprises a thickness within a range of from about 0.5 nm to about 5 nm.

20. A method of forming an integrated assembly, comprising:

forming a first conductive lines extending horizontally along a first direction;

forming pillar structures extending upwardly from the first conductive lines; the pillar structures comprising first insulative material, the pillar structures being spaced from one another by gaps along the first direction;

forming a two-dimensional-material extending along upper surfaces of the first conductive lines within the gaps, and along vertical sidewalls and upper surfaces outer peripheries of the pillar structures;

forming a first electrostatic-doping-material over and in direct physical contact with the two-dimensional-material that is along the upper surfaces of the first conductive lines, the first electrostatic-doping-material being in direct physical contact with adjacent lower vertical sidewall regions of the two-dimensional-material adjacent the structures;

forming a second insulative material over the first electrostatic-doping-material and in direct physical contact with adjacent central vertical sidewall regions of the two-dimensional-material adjacent the structures;

forming second conductive lines extending along a second direction which crosses the first direction; the second conductive lines being over the first electrostatic-doping-material and being adjacent the second insulative material;

forming a second electrostatic-doping-material over the second conductive lines and over the second insulative material, the second electrostatic-doping-material being in direct physical contact with adjacent upper vertical sidewall regions of the two-dimensional-material adjacent the structures; and forming storage elements coupled with the upper region of the two-dimensional-material.

\* \* \* \* \*